United States Patent [19]

Takiar et al.

[11] Patent Number: 4,810,620

[45] Date of Patent: Mar. 7, 1989

[54] NICKEL PLATED TAPE

[75] Inventors: Hem P. Takiar, San Jose; Divyesh P. Shah, Sunnyvale; Robert E. Hilton, Cupertino, all of Calif.

[73] Assignee: National Semiconductor Corporation, Santa Clara, Calif.

[21] Appl. No.: 90,264

[22] Filed: Aug. 27, 1987

Related U.S. Application Data

[62] Division of Ser. No. 748,876, Jun. 26, 1985, Pat. No. 4,707,418.

[51] Int. Cl.$^4$ .............................................. G03C 5/00
[52] U.S. Cl. ..................................... 430/314; 430/318; 430/320; 437/220; 357/69; 357/70; 704/15
[58] Field of Search ............... 430/313, 314, 318, 329, 430/320; 437/220; 357/69, 70; 204/15

[56] References Cited

U.S. PATENT DOCUMENTS 4,209,355  6/1980  Burns ................................. 156/630
4,210,926  7/1980  Hacke ................................. 357/70

Primary Examiner—José G. Dees
Attorney, Agent, or Firm—Gail W. Woodward; Lee Patch; Mark Aaker

[57] ABSTRACT

An improved copper bump tape for tape automated bonding inhibits electromigration of the copper after bonding to a semiconductor device. The improved tape is characterized by the plating of a migration resistant metal onto the inner ends of connector beams of the tape. The migration resistant metal is coated onto all surfaces of the connector bump, except for the surface which is to be bonded to the semiconductor device. In this way, the surfaces of the bump which remain exposed after connection to the semiconductor are inhibited from electromigration.

4 Claims, 1 Drawing Sheet

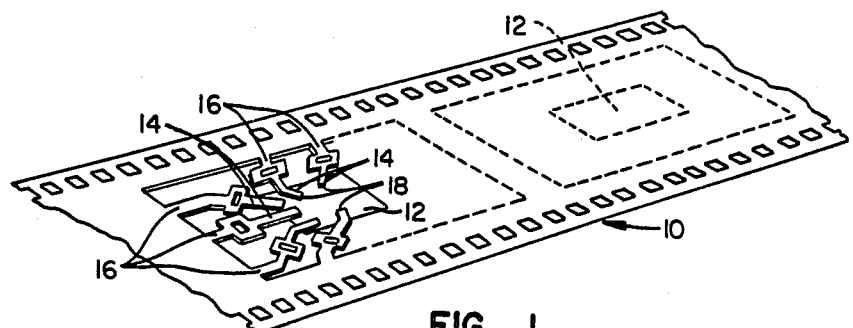
FIG._1.
FIG._2A.
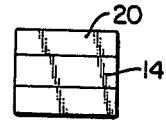
FIG._2B.
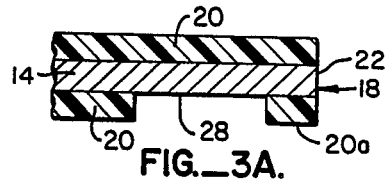
FIG._3A.
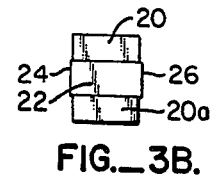
FIG._3B.
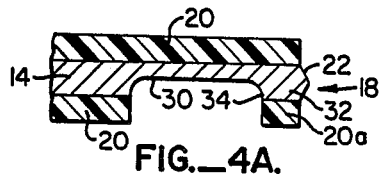
FIG._4A.
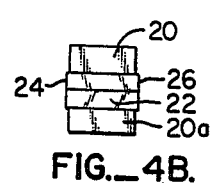
FIG._4B.
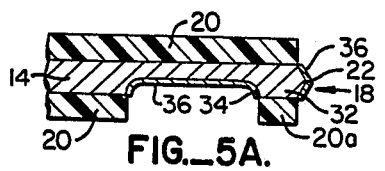
FIG._5A.
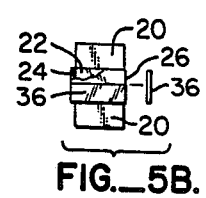
FIG._5B.
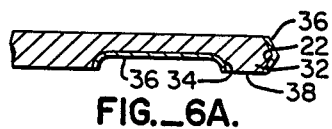
FIG._6A.
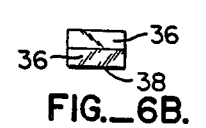
FIG._6B.

NICKEL PLATED TAPE

This is a divisional of co-pending application Ser. No. 748,876, filed on June 26, 1985, now U.S. Pat. No. 4,707,418.

BACKGROUND OF THE INVENTION

The present invention relates generally to the connection or bonding of integrated circuit dies to metal lead frames prior to encapsulation of the dies. More particularly, the invention relates to tape automated bonding of the dies to the lead frame with an improved copper tape treated to resist electromigration.

In the packaging of semiconductor devices, it is necessary to interconnect the device, generally referred to as a die or chip, to a plurality of electrical leads formed on a metal lead frame. Such interconnection is generally accomplished by one of two distinct techniques, referred to as wire bonding and tape automated bonding. Wire bonding is a sequential process where wire bonds are formed individually between bonding pads on the die and the inner ends of the leads on the frame. While the wire bonding is the method of choice for some applications, it is relative slow since it requires that the bonds be formed one after the other. Wire bonding a die can require several seconds to complete even with the most rapid automatic wire bonding equipment.

Tape automated bonding, in contrast, allows the formation of all connections between the die and the lead frame to be made simultaneously. A metal tape, typically copper, is fabricated by conventional stamping and etching techniques so that a plurality of individual leads, often referred to as beams, are formed. The beams are cantilevered from the tape. That is, they remain connected to the tape at their outer ends, while their inner ends are free to allow connection to the die. By forming the inner ends of the beams in a pattern which corresponds precisely to the pattern of metallization pads formed on the die, the inner ends of the beams can be aligned with the die and then connected in a single compression and heating step. In a similar operation, the outer ends of the beams are connected to the lead frames, and the beams then severed from the remainder of the tape.

In connecting the inner ends of the lead beams to the semiconductor die, it is necessary to form a bump on either the die or the beam. The bump, which is formed from metal, provides both the material necessary for forming the connection between the beam and the die, as well as providing for a short distance or offset between the beam and the die. There are advantages and disadvantages associated with forming the bump on either the semiconductor die or the beam. The present invention is directed at bumped bonding tapes, that is bonding tapes having a connection bump formed at their inner ends.

It has been found by the inventors herein that when employing copper tape for tape automated bonding, problems can arise with electromigration of the copper on the surface of the die. Such electromigration results from the potential difference between the metallization pads on the die which results in dendritic flow of the copper on the die surface. In the worst case, the copper can migrate and form a short between two or more of the metallization pads, rendering the device defective.

It would thus be desirable to provide an improved copper bonding tape which would avoid the problems associated with copper migration on the surface of a die. It would be particularly desirable if the method for forming the improved tape would require only small departures from existing techniques for copper tape fabrication.

SUMMARY OF THE INVENTION

The present invention provides for an improved highly reliable copper bump tape wherein all surfaces of the bump, other than that surface which bonds to a metallization pad on a semiconductor device, are coated with a thin layer of a migration resistant metal, typically nickel or a nickel alloy. The migration resistant layer prevents electromigration of the copper caused by the potential difference between various metallization pads on the die surface. The metal layer also enhances the strength of the tape as well as inhibiting corrosion of the tape during subsequent processing steps, yielding a highly reliable final product. The method of the present invention utilized to fabricate such tape is particularly advantageous since it requires the addition of only a single processing step to conventional tape fabrication processes.

The method of the present invention is utilized with single layer copper tape which are formed with connector bumps at the inner ends of connector beams. The connector bumps are formed in the connector beams by conventional photoresist processing techniques. First, both sides of the copper tape are coated with photoresist, and the photoresist is patterned to form bumps of the desired dimensions. After developing the photoresist, and etching the copper to form the bumps, all surfaces of the bump are exposed except for a flat connecting surface which will be joined to the metallization pad on the die. A nickel layer is then applied to the tape, and deposits on all surfaces of the bump other than the bonding surface. Thus, after the photoresist is stripped, the bumps on the copper tape are coated on all exposed surfaces except for that which will be joined to the semiconductor die.

BRIEF DESCRIPTION OF THE DRAWINGS

FIG. 1 is a perspective view of a copper bonding tape prior to processing by the method of the present invention.

FIG. 2A is a cross-sectional view of an individual connector beam having a layer of photoresist deposited on both sides.

FIG. 2B is a right-end view of the coated connector beam of FIG. 2A.

FIG. 3A is a cross-sectional view illustrating the connector beam of FIG. 2A, with the photoresist patterned and developed to expose the surfaces of the connector beam which are to be etched to form the connector bump.

FIG. 3B is a right-end view of the connector beam of FIG. 3A.

FIG. 4A is a cross-sectional view of the connector beam of FIG. 3A, illustrated after etching.

FIG. 4B is a right-end view of the connector beam of FIG. 4A.

FIG. 5A is a cross-sectional view of the connector beam of FIG. 4A, illustrated after a migration resistant layer has been deposited on the exposed surfaces.

FIG. 5B is a right-end view of the connector beam of FIG. 5A.

FIG. 6A is a cross-sectional view of the connector beam of FIG. 5A, shown after the photoresist has been stripped.

FIG. 6B is a right-end view of the connector beam of FIG. 6A.

DESCRIPTION OF THE PREFERRED EMBODIMENT

FIG. 1 illustrates a single layer copper tape 10 of the type which may be utilized in the present invention. The tape 10 includes a plurality of individual frames 12, each of which include a number of individual connector beams 14. The connector beams are formed by punching the tape so that the beams 14 are conneted at their outer ends 16 to the tape, while their inner ends 18 are suspended freely about the central opening of the frame 12. By properly positioning the inner ends 18 of the beams 14, the pattern of the inner ends will correspond to the pattern of bonding pads on a particular semiconductor die (not illustrated).

The method of the present invention provides for the formation of connector bumps at the inner ends 18 of the beams 14. During the formation of the bumps, as will be described in detail hereinafter, a migration-resistant metal layer is applied to all surfaces of the bumps other than the surface which is eventually bonded to the bonding pads on the semiconductor device. Such a metal coating prevents electromigration of the copper when it is bonded to the semiconductor device, as well as inhibiting corrosion and strengthening the connector beams.

Referring now to FIGS. 2-6, the processing method of the present invention will be described in detail. After proper cleaning of the copper tape 10, a photoresist layer 20 is applied to the tape 10 in a conventional manner. The photoresist 20 on an individual connector beam 14 is illustrated in FIGS. 2A and 2B.

The photoresist layer 20 is then patterned and developed to form the pattern as illustrated in FIGS. 3A and 3B. The connector beam 14 is exposed on three surfaces 22, 24, and 26 at its inner end 18. A fourth surface 28 (spaced away from the inner end 18) is also exposed.

The construct illustrated in FIGS. 3A and 3B is then exposed to an anisotropic etching process where exposed horizontal surfaces, such as surface 28, are preferentially etched relative to substantially vertical surfaces such as 22, 24, and 26. References to horizontal and vertical will be made relative to the drawings, and it will be appreciated that in practice the tape may be oriented in any preselected direction so long as the direction of etching is oriented to preferentially etch surface 28.

The result of the anisotropic etching is illustrated in FIGS. 4A and 4B. A cavity 30 is formed in the exposed area 28, while the exposed surfaces 22, 24, and 26 are subtantially unchanged. As a result of the formation of cavity 30, a connector bump 32 is formed at the inner end 18 of the connector beam 14. The bump 32 includes four exposed surfaces 22, 24, 26, and 34. The remaining surface of the bump is covered by the photoresist layer 20a. It is this covered surface which will eventually be bonded to the metallization pad on the semiconductor device.

Referring now to FIGS. 5A and 5B, a non-migrating metal layer 36 is plated onto the exposed areas of the connector beams 14. Suitable migration-resistant metals include nickel, nickel alloys, chromium, titanium/tungsten, palladium, gold, and the like. Preferred is the nickel coating because it is generally less expensive. The metal layer 36 may be deposited by conventional electroplating techniques. The thickness of the migration resistant metal layer will be in the range of about 0.1 micron to 10 microns, usually being about 0.25 micron.

Referring now to FIGS. 6A and 6B, the photoresist layer 20 is stripped, leaving the connector bump 32 protected by the metal coating 36 on four side surfaces 22, 24, 26, and 32 adjacent a bonding surface 38 on the bottom bonding. The bonding surface 38, which is free from the nickel coating, is intended to be bonded to the metallization pads on the semiconductor device by conventional techniques. After such bonding, the nickel layers on the adjacent surfaces of the bump 32 will inhibit electromigration of the copper on the surface of the semiconductor.

The remaining processing steps in the tape automated bonding of the semiconductor to the copper tape are conventional and need not be described here.

Although the foregoing invention has been described in some detail by way of illustration and example for purposes of clarity of understanding, it will be obvious that certain changes and modifications may be practiced within the scope of the appended claims.

What is claimed is:

1. A process for fabricating copper bump tape, said process comprising:

applying a photoresist layer to both sides of the tape;

exposing the photoresist to form a pattern which defines a bump on the inner ends of connector beams on the tape;

developing the photoresist to expose the inner ends of the connector beams, except for a surface which defines the bump;

etching the copper tape to form the bump;

plating a layer of a migration resistant metal onto the copper while the photoresist remains in place, whereby the exposed surfaces of the bump are coated with the migration resistant metal, but the surface protected by photoresist is not coated; and removing the remaining photoresist.

2. A process as in claim 1, wherein the migration resistant metal is nickel or a nickel alloy.

3. A process as in claim 1, wherein the migration resistant metal is plated to a thickness in the range of $0.1\mu$ to $10\mu$.

4. A process as in claim 3, wherein the thickness is $0.25\mu$.

* * * * *